United States Patent
Kim et al.

(10) Patent No.: US 10,976,389 B2
(45) Date of Patent: Apr. 13, 2021

(54) RADIOFREQUENCY COIL

(71) Applicants: Samsung Electronics Co., Ltd., Suwon-si (KR); Samsung Life Public Welfare Foundation, Seoul (KR)

(72) Inventors: Kyoungnam Kim, Gunpo-si (KR); Yeon Hyeon Choe, Seoul (KR)

(73) Assignees: Samsung Electronics Co., Ltd., Suwon-si (KR); Samsung Life Public Welfare Foundation, Seoul (KR)

( * ) Notice: Subject to any disclaimer, the term of this patent is extended or adjusted under 35 U.S.C. 154(b) by 371 days.

(21) Appl. No.: 15/109,539

(22) PCT Filed: Jan. 2, 2015

(86) PCT No.: PCT/KR2015/000027
§ 371 (c)(1),
(2) Date: Jul. 1, 2016

(87) PCT Pub. No.: WO2015/102434
PCT Pub. Date: Jul. 9, 2015

(65) Prior Publication Data
US 2016/0327620 A1    Nov. 10, 2016

(30) Foreign Application Priority Data

Jan. 3, 2014  (KR) .................. 10-2014-0000760
Jan. 8, 2014  (KR) .................. 10-2014-0002506

(51) Int. Cl.
*G01R 33/34*     (2006.01)
*G01R 33/3875*   (2006.01)
*G01R 33/341*    (2006.01)

(52) U.S. Cl.
CPC ..... *G01R 33/34092* (2013.01); *G01R 33/341* (2013.01); *G01R 33/3875* (2013.01)

(58) Field of Classification Search
CPC ............ G01R 33/34092; G01R 33/341; G01R 33/3875
See application file for complete search history.

(56) References Cited

U.S. PATENT DOCUMENTS 4,793,356 A * 12/1988 Misic .................. G01R 33/341
                                                          324/318
4,816,765 A    3/1989 Boskamp
(Continued)

FOREIGN PATENT DOCUMENTS

JP    H02-191433 A    7/1990
JP    2007-260079 A   10/2007

OTHER PUBLICATIONS

Korean Office Action dated Oct. 16, 2019 in corresponding Korean Patent Application No. 10-2014-0002506 (5 pages in English, 6 pages in Korean).

*Primary Examiner* — Paresh Patel
(74) *Attorney, Agent, or Firm* — NSIP Law

(57) ABSTRACT

An RF coil structure used for a magnetic resonance imaging (MRI) system includes a main loop coil having a first electric conductor and a second electric conductor facing the first electric conductor, and an auxiliary loop coil forming an angle α with the main loop coil and having a third electric conductor and a fourth electric conductor facing the third electric conductor between the first electric conductor and the second electric conductor.

32 Claims, 8 Drawing Sheets

(56) References Cited

U.S. PATENT DOCUMENTS

| | | | |
|---|---|---|---|
| 4,839,595 A * | 6/1989 | Boskamp | G01R 33/341 324/318 |
| 5,017,872 A | 5/1991 | Foo et al. | |
| 5,143,688 A * | 9/1992 | Mansfield | G01R 33/341 324/318 |
| 5,196,796 A * | 3/1993 | Misic | A61B 5/0555 324/322 |
| 5,483,159 A * | 1/1996 | Van Heelsbergen | G01R 33/3678 324/318 |
| 5,592,088 A * | 1/1997 | Matsunaga | G01R 33/34053 324/318 |
| 5,663,645 A * | 9/1997 | Kaufman | G01R 33/34046 324/318 |
| 5,689,189 A * | 11/1997 | Morich | G01R 33/341 324/318 |
| 6,198,962 B1 * | 3/2001 | Su | G01R 33/34046 324/318 |
| 6,404,201 B1 | 6/2002 | Boskamp | |
| 6,493,572 B1 * | 12/2002 | Su | G01R 33/3415 324/318 |
| 6,768,303 B1 * | 7/2004 | Su | G01R 33/34046 324/309 |
| 7,002,347 B2 | 2/2006 | Feiweier et al. | |
| 7,242,192 B2 | 7/2007 | Warntjes | |
| 7,279,898 B2 * | 10/2007 | Kleihorst | G01R 33/341 324/318 |
| 7,408,351 B2 * | 8/2008 | Yoshida | G01R 33/34046 324/307 |
| 7,511,498 B2 | 3/2009 | Fujimoto et al. | |
| 8,742,759 B2 * | 6/2014 | Soutome | G01R 33/365 324/318 |
| 8,779,768 B2 * | 7/2014 | Brey | G01R 33/38 324/307 |
| 2004/0061498 A1 * | 4/2004 | Ochi | G01R 33/3415 324/318 |
| 2008/0150533 A1 | 6/2008 | Habara et al. | |
| 2010/0033177 A1 * | 2/2010 | Ochi | A61B 5/055 324/307 |
| 2010/0141258 A1 | 6/2010 | Saha | |
| 2011/0121834 A1 | 5/2011 | Soutome et al. | |
| 2014/0176274 A1 * | 6/2014 | Chiang | H01F 38/14 336/170 |

* cited by examiner

PRIOR ART

RADIOFREQUENCY COIL

CROSS-REFERENCE TO RELATED APPLICATIONS

This application claims the benefit under 35 USC 119(a) of PCT Application No. PCT/KR2015/000027, filed on Jan. 2, 2015, which claims the benefit of Korean Patent Application Nos. 10-2014-0000760 filed Jan. 3, 2014, and 10-2014-0002506 filed Jan. 8, 2014, in the Korean Intellectual Property Office, the entire disclosure of which is incorporated herein by reference for all purposes.

TECHNICAL FIELD

The present disclosure relates to a radiofrequency (RF) coil or RF coil structure used for a magnetic resonance imaging (MRI) system, and more particularly, to an RF coil or RF coil structure which improves uniformity of a B1 magnetic field.

BACKGROUND ART

FIG. 1 illustrates a general magnetic resonance imaging (MRI) system, which is disclosed in U.S. Pat. No. 7,002,347. For convenience of explanation, terms and reference numerals are modified. An MRI system may include a magnet 1 for generating a main magnetic field, a transmitting radio frequency (RF) coil 2 for generating a magnetic field that makes hydrogen nucleuses of a test object 4 enter an excited state, a receiving RF coil 3 for receiving an RF signal generated when the excited hydrogen nucleus of the test object 4 returns to a ground state, and a table 5 for placing the test object 4 thereon. In general, a main magnetic field is referred to as a B0 magnetic field and a magnetic field generated by the transmitting RF coil 2 is referred to as a B1 magnetic field. The B0 magnetic field is formed in a Z-axis direction and the B1 magnetic field is formed in an X-axis direction perpendicular to the direction of the B0 magnetic field. The transmitting RF coil 2 not only generates a magnetic field, but also receives an RF signal. Also, the receiving RF coil 3 not only receives the RF signal, but also generates the B1 magnetic field, if necessary. Accordingly, unless specified otherwise below, the term "RF coil" is used as having both meanings of a transmitting RF coil and a receiving RF coil. The strength and uniformity of the B0 magnetic field are important in relation to the quality of an MRI image. Also, uniformity of the B1 magnetic field is important in relation to the quality of an MRI image. Among them, regarding the B1 magnetic field generated by the transmitting RF coil 2, even when the transmitting RF coil 2 generates a uniform B1 magnetic field, the B1 magnetic field becomes irregular on the test object 4 to be measured due to a varying distance between the transmitting RF coil 2 and the test object 4.

FIG. 2 illustrates that a B1 magnetic field generated by an RF coil 6 becomes irregular on a test object due to a varying distance between the RF coil 6 and the test object.

Test objects 7 and 8 are each placed between a pair of RF coils 6. When the shape of the test object 7 is rectangular, a distance L between the RF coil 6 and the test object 7 is constant as indicated by an arrow. However, when the shape of the test object 8 is circular, the distance between the RF coil 6 and the test object 8 varies between distances L1 and L2 depending on a position on a surface of the test object 8 as indicated by arrows. As is well known to one of ordinary skill in the art, as the distance from the RF coil 6 increases, the strength of the B1 magnetic field decreases. Accordingly, the strength of the B1 magnetic field generated by the RF coil 6 is uniform at any position on the test object 7 having the constant distance L. However, the strength of the B1 magnetic field on the test object 8 having differing distances L1 and L2 varies depending on the distance between the test object 8 and the RF coil 6. Since the strength of the B1 magnetic field differs at positions having a varying distance between the RF coil 6 and the test object 8, the level of exited state of hydrogen nucleuses varies accordingly and thus, the RF signal of hydrogen nucleuses used to form an MRI image of the test object differs, which deteriorates the quality of the MRI image. Even when the distance from the test object 7 is constant, the B1 magnetic field may be irregular due to a problem of the RF coil. In this case, the quality of the MRI image is also deteriorated.

To address the above problem, a variety of solutions have been developed.

Related arts to improve uniformity of the B1 magnetic field may include U.S. Pat. Nos. 5,017,872, 7,002,347, 7,242,192, and 8,188,737.

FIG. 3 illustrates an example of making a B1 magnetic field uniform, which is disclosed in U.S. Pat. No. 5,017,872. For convenience of explanation, terms and reference numerals are modified.

An RF coil structure 9 may include an RF coil 10, an RF shield 11, and a high dielectric material 12. When a test object 13 is placed inside the RF coil structure 9, the B1 magnetic field becomes irregular. To address the irregularity problem, the high dielectric material 12 is filled between the RF coil 10 and the RF shield 11.

FIG. 4 illustrates an example of making a B1 magnetic field uniform, which is disclosed in U.S. Pat. No. 7,242,192. For convenience of explanation, terms and reference numerals are modified.

An RF coil structure 14 may include a main RF coil 15 and an auxiliary RF coil 16. Although not illustrated in the drawing, when the RF coil structure 14 is in use, a distance between a test object and the RF coil structure 14 is not constant due to unevenness in a surface of the test object and thus, the B1 magnetic field is not uniform. To address the problem, the auxiliary RF coil 16 is arranged to make the B1 magnetic field uniform.

However, among the above-described structures used to make the B1 magnetic field uniform, in the structure of FIG. 3, since the high dielectric material 12 is uniformly arranged between the RF shield 11 and the RF coil 10, it may be difficult to overcome an influence of the unevenness in the surface of the test object or the difference in the distance between the test object and the RF coil. Also, in the structure of FIG. 4, it is inconvenient to use the auxiliary RF coil 15, in addition to the main RF coil 15. Furthermore, when the RF coil structure is arranged in a horizontal state with respect to the test object as illustrated in the RF coil structures of FIGS. 3 and 4, there is a problem in that the existence of the test object may deteriorate the uniformity of the B1 magnetic field regardless of the distance from the test object.

DETAILED DESCRIPTION OF THE INVENTIVE CONCEPT

Technical Problem

The present disclosure provides a radiofrequency (RF) coil or an RF coil structure used for a magnetic resonance imaging (MRI) system. The technical problems to be solved by the present disclosure are not limited to the above technical problems, and other technical problems may be inferred from the following embodiments.

Technical Solution

This section provides a general summary of the disclosure and is not a comprehensive disclosure of its full scope or all of its features.

According to one aspect of the present disclosure, there is provided a radiofrequency (RF) coil structure used for a magnetic resonance imaging (MRI) system, which includes a main loop coil having a first electric conductor and a second electric conductor facing the first electric conductor, and an auxiliary loop coil forming an angle α with the main loop coil and having a third electric conductor and a fourth electric conductor facing the third electric conductor between the first electric conductor and the second electric conductor.

According to another aspect of the present disclosure, there is provided an RF coil used for an MRI system, which includes a main loop coil having a first electric conductor and a second electric conductor, which are arranged parallel to a B0 magnetic field direction, and a first auxiliary loop coil having third electric conductor and a fourth electric conductor, which are arranged parallel to the first electric conductor and with the first electric conductor of the main loop coil interposed between the third electric conductor and the fourth electric conductor.

According to another aspect of the present disclosure, there is provided an RF coil used for an MRI system, which includes a main loop coil having a first electric conductor and a second electric conductor, which are arranged parallel to a B0 magnetic field direction, and an auxiliary loop coil having a third electric conductor and a fourth electric conductor, which are arranged parallel to the first electric conductor and between the first electric conductor and the second electric conductor of the main loop coil.

Advantageous Effects

The uniformity of a B1 magnetic field may be effectively improved by using a radiofrequency (RF) coil structure according to the present disclosure, compared to using only one RF coil that is horizontal or vertical with respect to a test object. Furthermore, as an RF coil according to the present disclosure is used, irregularity of a B1 magnetic field on the test object generated due to a varying distance between the RF coil and the test object may be effectively reduced. Furthermore, since only one RF source for applying a current or voltage to a main loop coil and an auxiliary loop coil is used, configuration of parts of an RF coil may be simplified.

BEST MODE

A radiofrequency (RF) coil structure used for a magnetic resonance imaging (MRI) system includes a main loop coil having a first electric conductor and a second electric conductor facing the first electric conductor, and an auxiliary loop coil forming an angle α with the main loop coil and having a third electric conductor and a fourth electric conductor facing the third electric conductor between the first electric conductor and the second electric conductor.

An RF coil used for an MRI system includes a main loop coil having a first electric conductor and a second electric conductor, which are arranged parallel to a B0 magnetic field direction, and a first auxiliary loop coil having third electric conductor and a fourth electric conductor, which are arranged parallel to the first electric conductor and with the first electric conductor of the main loop coil interposed between the third electric conductor and the fourth electric conductor.

An RF coil used for an MRI system includes a main loop coil having a first electric conductor and a second electric conductor, which are arranged parallel to a B0 magnetic field direction, and an auxiliary loop coil having a third electric conductor and a fourth electric conductor, which are arranged parallel to the first electric conductor and between the first electric conductor and the second electric conductor of the main loop coil.

MODE OF THE INVENTIVE CONCEPT

The present disclosure will now be described in detail with reference to the accompanying drawings.

Figure 5:
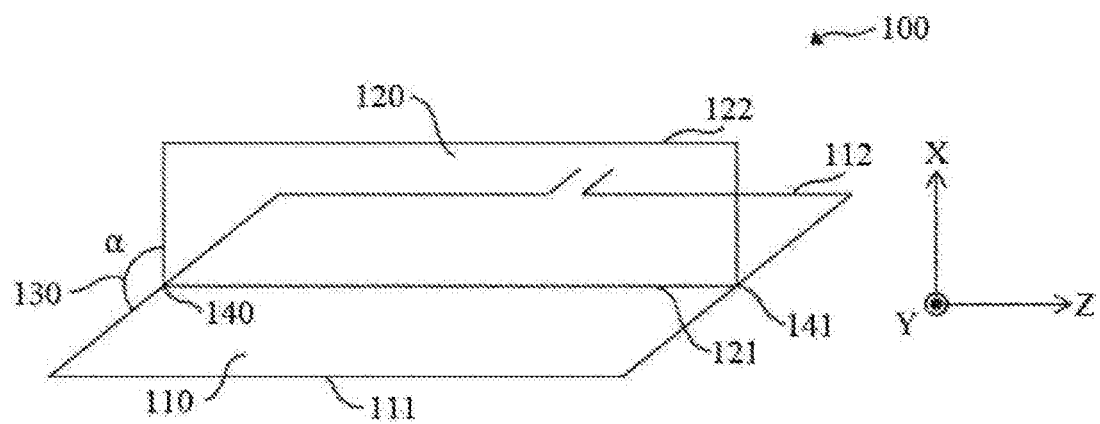
FIG. 5 illustrates an example of an RF coil structure according to the present disclosure.

FIG. 5 illustrates an example of a radiofrequency (RF) coil structure 100 according to the present disclosure.

The RF coil structure 100 according to the present disclosure may include a main loop coil 110 and an auxiliary loop coil 120. The main loop coil 110 may include a first electric conductor 111 and a second electric conductor 112 facing the first electric conductor 111. The auxiliary loop coil 120 may include a third electric conductor 121 and a fourth electric conductor 122. The auxiliary loop coil 120 is arranged between the first electric conductor 111 and the second electric conductor 112 of the main loop coil 110. Also, the auxiliary loop coil 120 forms an angle α 130 with the main loop coil 110 so that the auxiliary loop coil 120 is not located on the same plane as the main loop coil 110. The angle α 130 may be 90°. It is known to one of ordinary skill in the art that an electric conductor of an RF coil parallel to a main magnetic field direction mainly generates a B1 magnetic field and receives an RF signal. Although FIG. 5 illustrates that all of the first electric conductor 111 to the fourth electric conductor 122 are arranged parallel to the main magnetic field direction, the present disclosure is not limited thereto. In other words, at least one of the first electric conductor 111 and the second electric conductor 112 of the main loop coil 110 is parallel to the main magnetic field direction, that is, a Z axis. Also, at least one of the third electric conductor 121 and the fourth electric conductor 122 of the auxiliary loop coil 120 may be parallel to the main magnetic field direction. As is known to one of ordinary skill in the art, the RF coil includes an electric conductor and a capacitor. In the present disclosure, however, for convenience of explanation, the main loop coil 110 and the auxiliary loop coil 120 are illustrated with only electric conductors. The electric conductor refers to a conductive body formed of a material such as copper or silver. In the following drawings, the RF coil is illustrated with the electric conductor only. Also, the auxiliary loop coil 120 intersects with the main loop coil 110 at two points 140 and 141.

Figure 6:
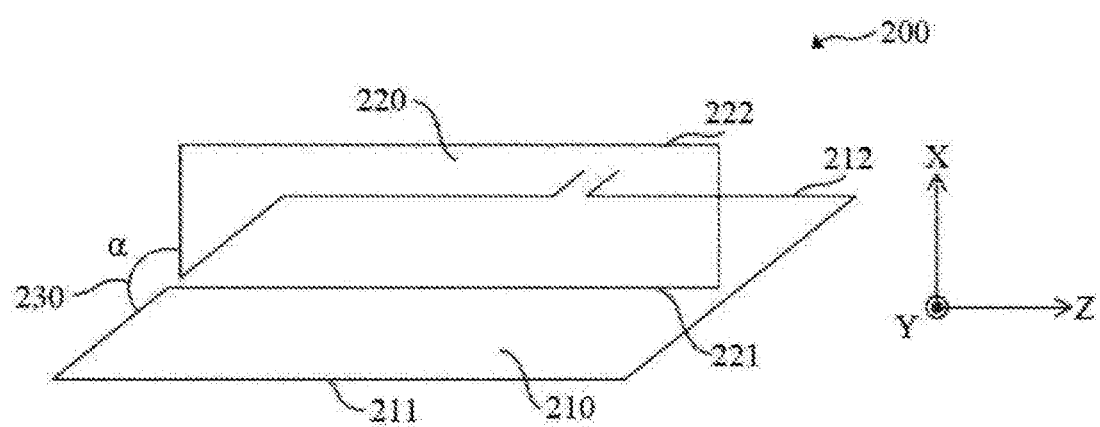
FIG. 6 illustrates another example of an RF coil structure according to the present disclosure.

FIG. 6 illustrates another example of an RF coil structure 200 according to the present disclosure.

The RF coil structure 200 according to the present disclosure may include a main loop coil 210 and an auxiliary loop coil 220. The main loop coil 210 may include a first electric conductor 211 and a second electric conductor 212 facing the first electric conductor 211. The auxiliary loop coil 220 may include a third electric conductor 221 and a fourth electric conductor 222. The auxiliary loop coil 220 is arranged between the first electric conductor 211 and the second electric conductor 212 of the main loop coil 210. Also, the auxiliary loop coil 220 forms an angle α 230 with the main loop coil 210 so that the auxiliary loop coil 220 is not located on the same plane as the main loop coil 210. The angle α 230 may be 90°. Also, the auxiliary loop coil 220 is serially connected to the main loop coil 210.

Figure 7:
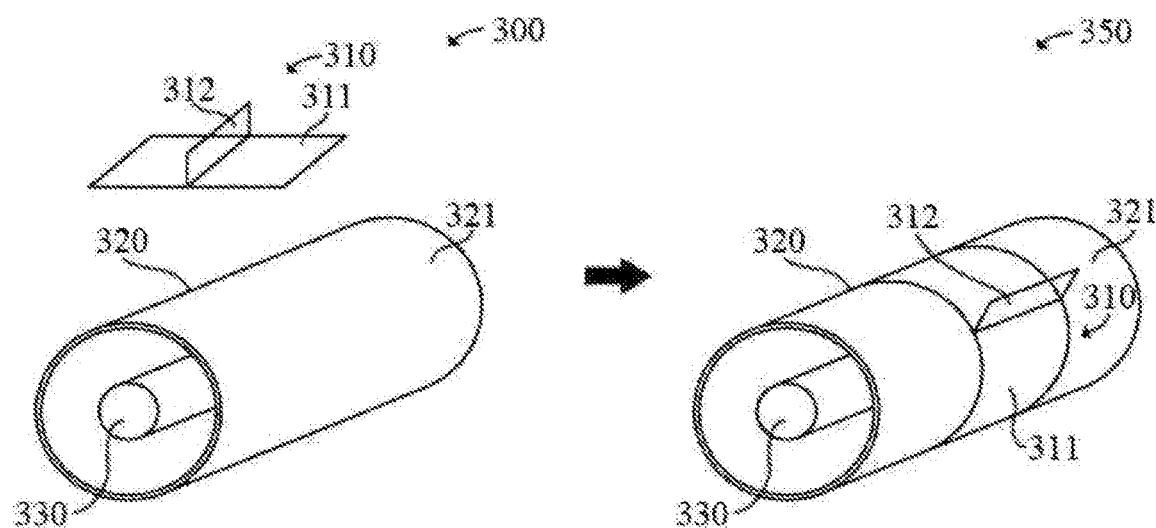
FIG. 7 illustrates another example of an RF coil structure according to the present disclosure.

FIG. 7 illustrates another example of an RF coil structure 310 according to the present disclosure.

The RF coil structure 310 according to the present disclosure is used by being coupled to a cylindrical support body 320 surrounding a test object 330. The cylindrical support body 320 may be formed of any material so long as the material does not affect the B1 magnetic field or an RF signal output from a test object 330 and is also capable of supporting the RF coil structure 310. For example, an acryl material may be used as the material of the cylindrical support body 320. Also, the cylindrical support body 320 has an inner space in which the test object 330 may be accommodated. A main loop coil 311 of the RF coil structure 310 may closely contact an outer surface 321 of the cylindrical support body 320. FIG. 7 illustrates a state 300 before the main loop coil 311 of the RF coil structure 310 closely contacts the cylindrical support body 320 and a state 350 after the main loop coil 311 of the RF coil structure 310 closely contacts the cylindrical support body 320. In the state 350 after the main loop coil 311 of the RF coil structure 310 closely contacts the cylindrical support body 320, the main loop coil 311 is bent along the shape of the cylindrical support body 320.

Figure 8:
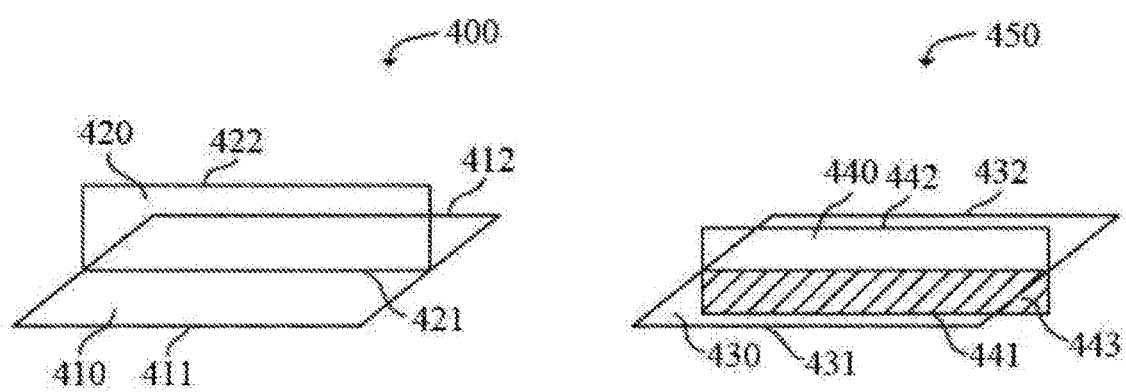
FIG. 8 illustrates another example of an RF coil structure according to the present disclosure.

FIG. 8 illustrates another example of an RF coil structure 400 according to the present disclosure.

The RF coil structure 400 according to the present disclosure may include a main loop coil 410 and an auxiliary loop coil 420. The main loop coil 410 may include a first electric conductor 411 and a second electric conductor 412 facing the first electric conductor 411. The auxiliary loop coil 420 may include a third electric conductor 421 and a fourth electric conductor 422. The auxiliary loop coil 420 is arranged between the first electric conductor 411 and the second electric conductor 412 of the main loop coil 410. Also, the auxiliary loop coil 420 forms an angle α with the main loop coil 410 so that the auxiliary loop coil 420 is not located on the same plane as the main loop coil 410. The angle α may be 90°. However, the third electric conductor 421 of the auxiliary loop coil 420 is located on the same plane as the main loop coil 410. To help with understanding of the present disclosure, an RF coil structure 450 is illustrated. A third electric conductor 441 of an auxiliary loop coil 440 is not located on the same plane as a main loop coil 430 and is lowered down under the main loop coil 430 by as much as a hatched portion 443. In this case, when the RF coil structure 450 is used by being arranged on the cylindrical support body 320 of FIG. 7, an interval may be generated between the cylindrical support body 320 and the main loop coil 430 due to the hatched portion 443. The interval may interfere with coupling between the RF coil structure 450 and the cylindrical support body 320. Accordingly, like the RF coil structure 400 according to the present disclosure, the third electric conductor 421 of the auxiliary loop coil 420 may be located on the same plane as the main loop coil 410.

A variety of embodiments according to the present disclosure are described below.

(1) An RF coil structure used for a magnetic resonance imaging (MRI) system including a main loop coil having a first electric conductor and a second electric conductor facing the first electric conductor, and an auxiliary loop coil forming an angle α with the main loop coil and having a third electric conductor and a fourth electric conductor facing the third electric conductor between the first electric conductor and the second electric conductor.

(2) The RF coil structure in which at least one of the first electric conductor and the second electric conductor is parallel to a main magnetic field direction.

(3) The RF coil structure in which at least one of the third electric conductor and the fourth electric conductor is parallel to the main magnetic field direction.

(4) The RF coil structure in which at least one of the first electric conductor and the second electric conductor is parallel to the main magnetic field direction and at least one of the third electric conductor and the fourth electric conductor is parallel to the main magnetic field direction.

(5) The RF coil structure in which the main loop coil and the auxiliary loop coil are connected in series to each other.

(6) The RF coil structure in which one of the third electric conductor and the fourth electric conductor is located on the same plane as the main loop coil.

(7) The RF coil structure in which the angle α is about 90°.

(8) The RF coil structure including a support body having an inner space and an outer surface on which the main loop coil is arranged.

(9) The RF coil structure in which the shape of the support body is cylindrical.

(10) The RF coil structure in which a material of the support body is an acryl material.

(11) The RF coil structure including a support body having an inner space and an outer surface on which the main loop coil is arranged, in which the angle α is about 90°.

(12) The RF coil structure including a support body having an inner space and an outer surface on which the main loop coil is arranged, in which one of the third electric conductor and the fourth electric conductor is located on the same plane as the main loop coil.

(13) The RF coil structure including a support body having an inner space and an outer surface on which the main loop coil is arranged, in which the main loop coil closely contacts the support body.

As the RF coil structure according to the present disclosure is used, uniformity of a B1 magnetic field may be effectively improved, compared to a case in which only one RF coil that is horizontal or vertical with respect to the test object is used.

Figure 9:
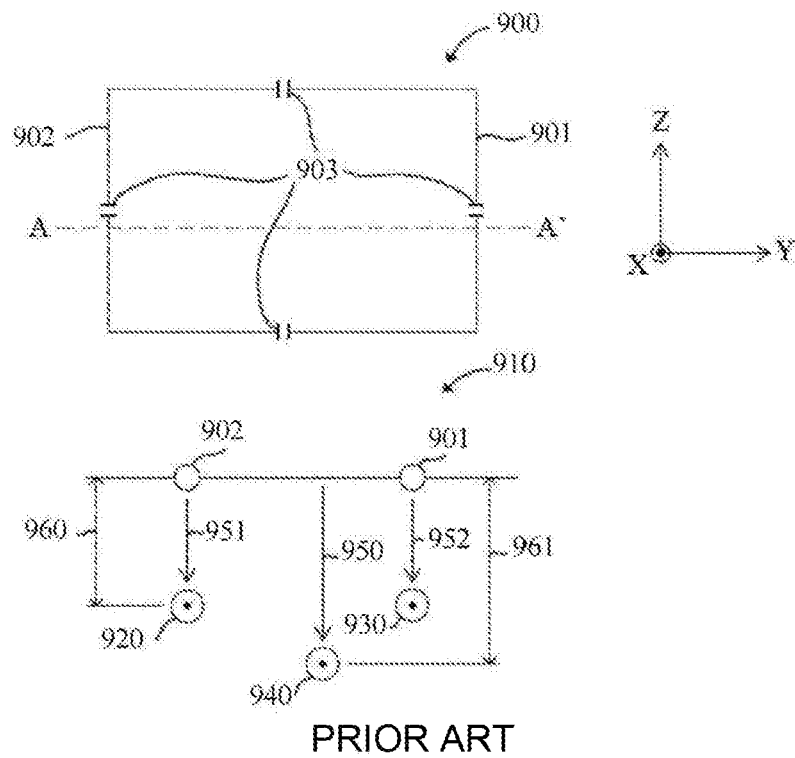
FIG. 9 illustrates a problem of the related art.

FIG. 9 illustrates a problem of the related art.

Figure 1:
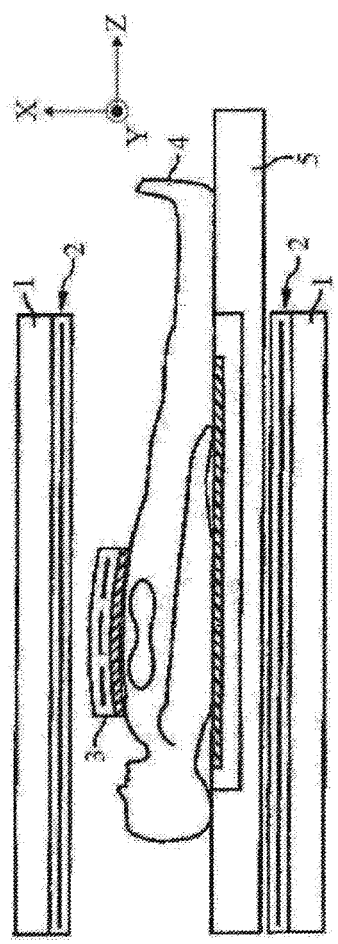
FIG. 1 illustrates an example of a general magnetic resonance imaging (MRI) system.
Figure 2:
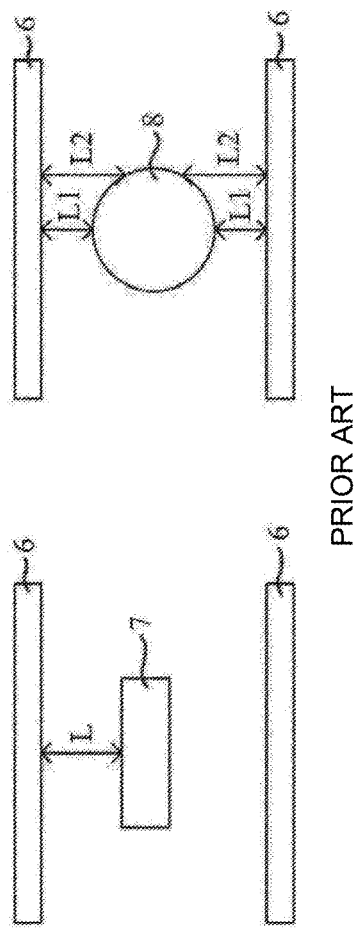
FIG. 2 illustrates that a B1 magnetic field generated by a radiofrequency (RF) coil becomes irregular on a test object due to a varying distance between the RF coil and the test object.
Figure 3:
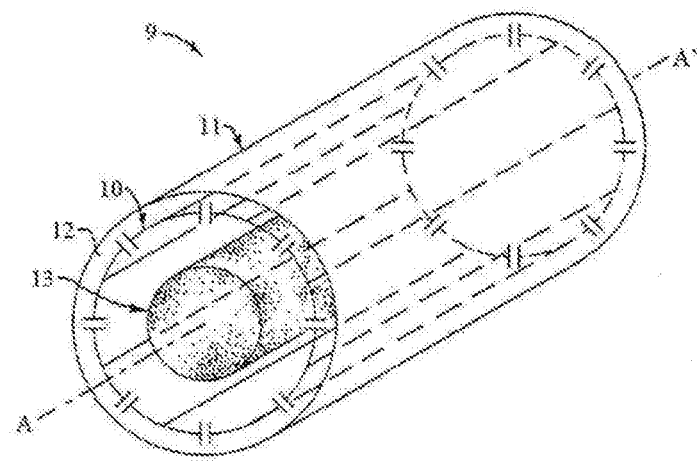
FIG. 3 illustrates an example of making a B1 magnetic field uniform, which is disclosed in U.S. Pat. No. 5,017,872.
Figure 4:
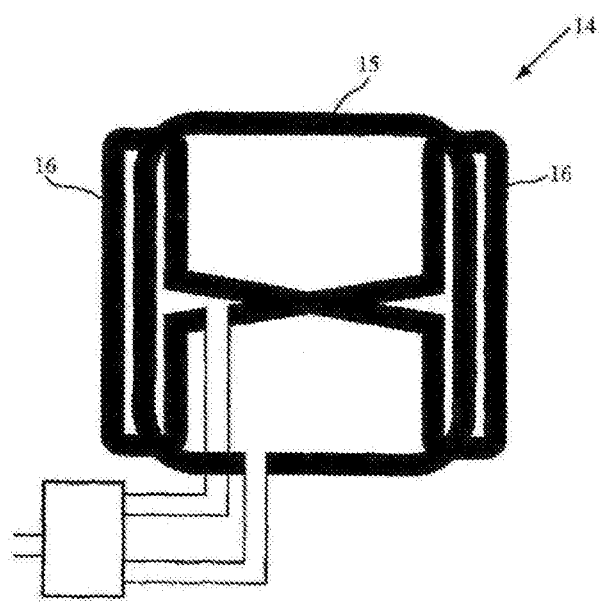
FIG. 4 illustrates an example of making a B1 magnetic field uniform, which is disclosed in U.S. Pat. No. 7,242,192.

An RF coil 900 may include a first electric conductor 901 parallel to the B0 magnetic field direction, a second electric conductor 902, and a capacitor 903. An electric conductor refers to a conductive body formed of a conductive material such as copper or silver. As known to one of ordinary skill in the art, the B1 magnetic field makes hydrogen nucleuses of the test object in an excited state and the B1 magnetic field is mainly generated by the first and second electric conductors 901 and 902 of the RF coil 900 parallel to the B0 magnetic field direction. A cross-section 910 of the RF coil 900 taken along a line AA' shows that the strength of the B1 magnetic field generated by the RF coil 900 is different on each of test objects 920, 930, and 940 if a distance between each of the test objects 920, 930, and 940 and the RF coil 900 is different. In other words, since a distance 961 between the test object 940 and the RF coil 900 is longer than a distance 960 between each of the test objects 920 and 930 and the RF coil 900, as described in FIG. 2, the strength of a B1 magnetic field 950 on the test object 940 is weaker than the strength of B1 magnetic fields 951 and 952 on the test objects 920 and 930 and thus the strength of the B1 magnetic field is different on the test objects 920, 930, and 940. To address this problem, U.S. Pat. No. 7,242,192 discloses a solution of arranging an RF source in each of a main RF coil and an auxiliary RF coil, which is inconvenient.

Figure 10:
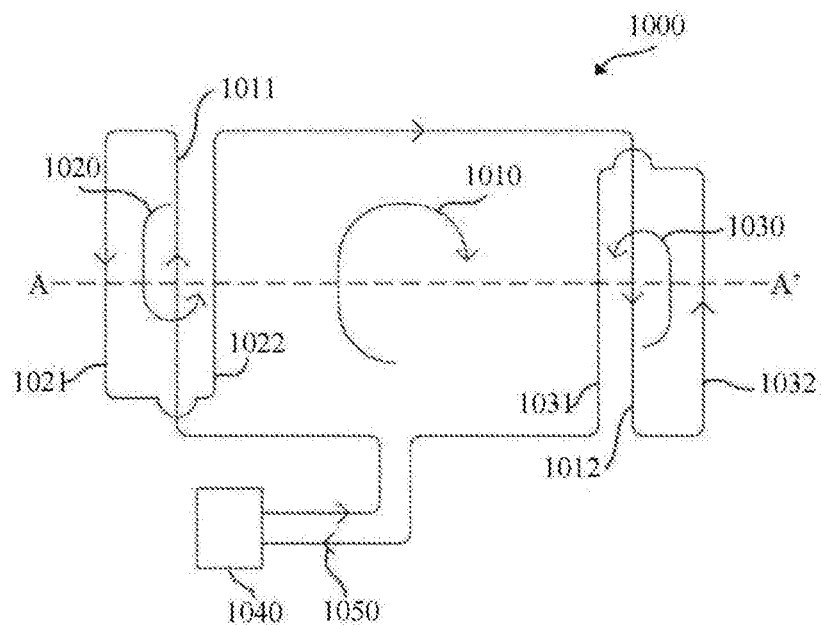
FIG. 10 illustrates an example of an RF coil according to the present disclosure.

FIG. 10 illustrates an example of an RF coil 1000 according to the present disclosure.

The RF coil 1000 may include a main loop coil 1010 having a first electric conductor 1011 and a second electric conductor 1012, which are arranged parallel to the B0 magnetic field direction, and a first auxiliary loop coil 1020 having a third electric conductor 1021 and a fourth electric conductor 1022, which are arranged parallel to the first electric conductor 1011 and with the first electric conductor 1011 interposed between the third electric conductor and the fourth electric conductor 1021 and 1022. Furthermore, the RF coil 1000 may include, with the first auxiliary loop coil 1020, a second auxiliary loop coil 1030 having a fifth electric conductor 1031 and a sixth electric conductor 1032, which are arranged parallel to the second electric conductor 1012 of the main loop coil 101 and with the second electric conductor 1012 interposed between the fifth and sixth electric conductors 1031 and 1032. For convenience of explanation, a capacitor in the RF coil 1000 is omitted in the illustration. The directions of arrows in the main loop coil 1010 and the first and second auxiliary loop coils 1020 and 1030 indicate directions in which a current flows in each loop coil. Also, the RF coil 1000 may include an RF source 1040 for applying a current to the RF coil 1000. Although the present drawing illustrates that the RF source 1040 applies a current to the RF coil 1000, the RF source 1040 may apply a voltage to the RF coil 1000. Also, the RF source 1040 is necessary for a transmitting RF coil only and may not be necessary when the RF coil 1000 functions as a receiving RF coil. The direction of a current flowing in each electric conductor is indicated by an arrow 1050. Since one RF coil 1000 includes the main loop coil 1010 and the first and second auxiliary loop coils 1020 and 1030, only one RF source 1040 is sufficient unlike the invention of U.S. Pat. No. 7,242,192 of the related art. The direction of a flow of current indicated on the drawing is based on when the RF coil 1000 functions as a transmitting RF coil, to describe a principle of improving uniformity of the B1 magnetic field. As is well known to one of ordinary skill in the art, the direction of a flow of current determines the direction of a magnetic field generated thereby. Accordingly, the direction of a flow of current indicated on the drawing does not limit the scope of right, and in the following drawings the indication of the direction of a flow of current is used for the same purpose.

Figure 11:
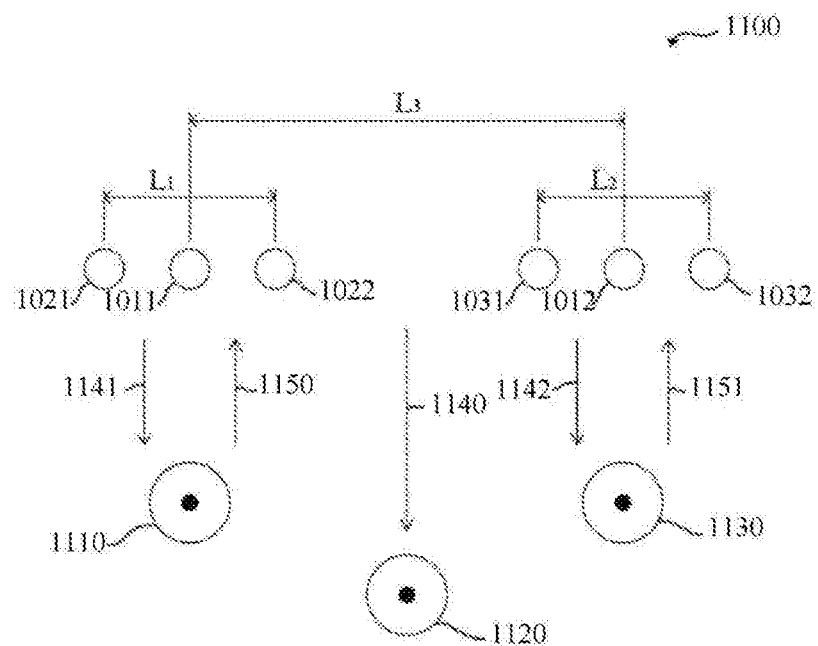
FIG. 11 is a cross-sectional view of the RF coil of FIG. 10 taken along a line AA'.

FIG. 11 is a cross-sectional view of the RF coil 1000 of FIG. 10 taken along a line AA'.

A cross-section 1100 of the RF coil 1000 taken along a line AA' shows how the RF coil 1000 according to the present disclosure improves uniformity of the strength of the B1 magnetic field on test objects 1110, 1120, and 1130 spaced by different distances from the RF coil 1000. In other words, the strength of B1 magnetic fields 1141 and 1142 on the test objects 1110 and 1130 relatively close to the RF coil 1000 are greater than the strength of a B1 magnetic field 1140 on the test object 1120 relatively far from the RF coil 1000. Accordingly, in order to make the strength of the B1 magnetic field uniform on any test object, the strength of the B1 magnetic field is increased in a portion where the strength of the B1 magnetic field is weak and the strength of the B1 magnetic field is decreased in a portion where the strength of the B1 magnetic field is strong. In the RF coil 1000 according to the present disclosure, the first and second auxiliary loop coils 1020 and 1030 generate magnetic fields 1150 and 1151 in the opposite direction to the B1 magnetic field generated by the main loop coil 1010 and thus the strength of the B1 magnetic field in the portion where the strength of the B1 magnetic field is strong may be decreased, thereby improving uniformity of the strength of the B1 magnetic field. However, to prevent the magnetic field generated by the auxiliary loop coils 1020 and 1030 from affecting the B1 magnetic field 1140 generated by the main loop coil 1010, a distance L1 between the third electric conductor 1021 and the fourth electric conductor 1022 of the first auxiliary loop coil 1020 is sufficiently smaller than a distance L3 between the first electric conductor 1011 and the second electric conductor 1012 of the main loop coil 1010. The distance L1 is smaller than a distance equivalent to 0.25×L3, that is, the distance L3 is about 4 times greater than the distance L1. Also, likewise, the distance L2 between the fifth electric conductor 1031 and the sixth electric conductor 1032 of the second auxiliary loop coil 1030 is smaller than a distance equivalent to 0.25×L3, that is, the distance L3 is about 4 times greater than the distance L2.

Figure 12:
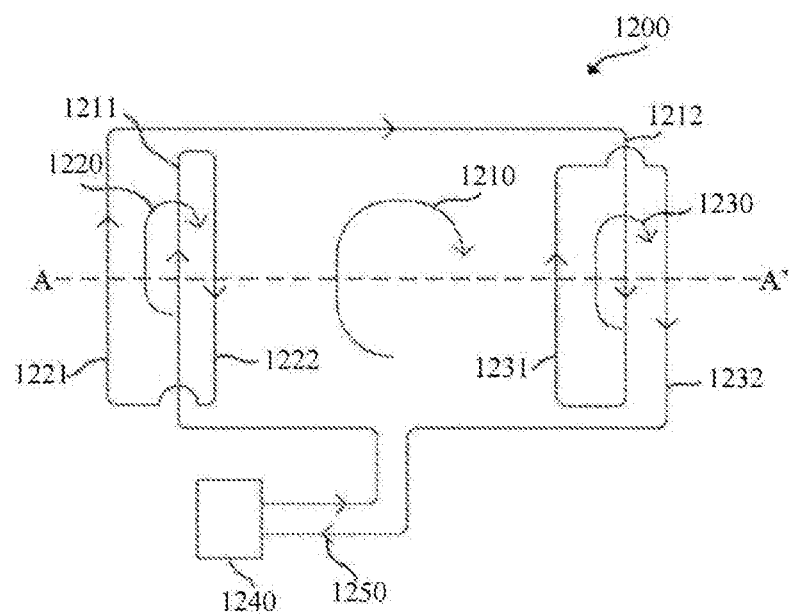
FIG. 12 illustrates another example of an RF coil according to the present disclosure.

FIG. 12 illustrates another example of an RF coil 1200 according to the present disclosure.

The RF coil 1200 may include a main loop coil 1210 having a first electric conductor 1211 and a second electric conductor 1212, which are arranged parallel to the B0 magnetic field direction, and a first auxiliary loop coil 1220 having a third electric conductor 1221 and a fourth electric conductor 1222, which are arranged parallel to the first electric conductor 1211 and with the first electric conductor 1211 interposed between. Furthermore, the RF coil 1200 may include, with the first auxiliary loop coil 1220, a second auxiliary loop coil 1230 having a fifth electric conductor 1231 and a sixth electric conductor 1232, which are arranged parallel to the second electric conductor 1212 of the main loop coil 1210 and with the second electric conductor 1212 interposed between the fifth and sixth electric conductors 1231 and 1232. For convenience of explanation, a capacitor in the RF coil 1200 is omitted in the illustration. The directions of arrows in the main loop coil 1210 and the first and second auxiliary loop coils 1220 and 1230 indicate directions in which a current flows in each loop coil. Also, the RF coil 1200 includes an RF source 1240 for applying a current to the RF coil 1200. Although in the present drawing the RF source 1240 applies a current to the RF coil 1200, the RF source 1240 may apply a voltage to the RF coil 1200. Also, the RF source 1240 is necessary for a transmitting RF coil only and may not be necessary when the RF coil 1200 functions as a receiving RF coil. The direction of a current flowing in each electric conductor is indicated by an arrow 1250. When the RF coil 1200 of FIG. 12 is compared with the RF coil 1000 of FIG. 10, the directions of current flows in the first and second auxiliary loop coils 1020 and 1030 and the first and second auxiliary loop coils 1220 and 1230 corresponding thereto are opposite to each other.

Figure 13:
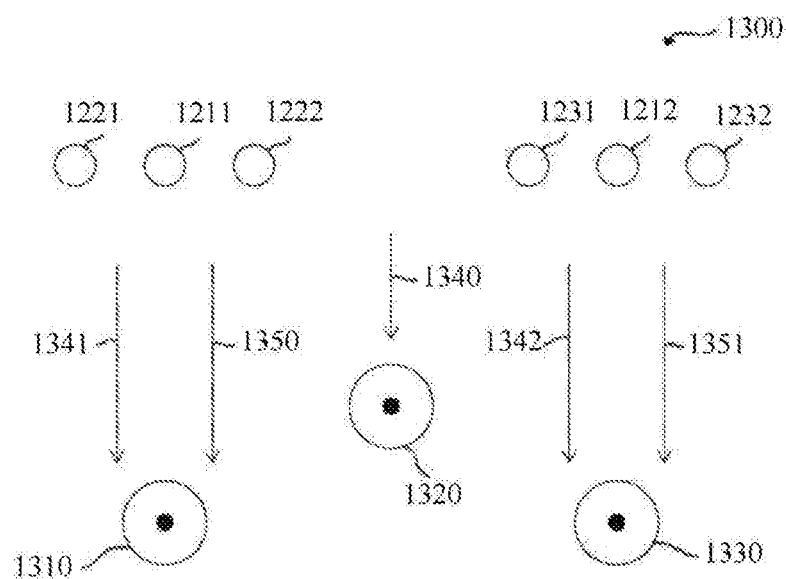
FIG. 13 is a cross-sectional view of the RF coil of FIG. 12 taken along a line AA'.

FIG. 13 is a cross-sectional view of the RF coil 1200 of FIG. 12 taken along a line AA'.

A cross-section 1300 of the RF coil 1200 taken along a line AA' shows how the RF coil 1200 according to the present disclosure improves uniformity of the strength of the B1 magnetic field on test objects 1310, 1320, and 1330 spaced by different distances from the RF coil 1200. In other words, the strength of a B1 magnetic field 1340 on the test object 1320 relatively close to the RF coil 1200 is greater than the strength of B1 magnetic fields 1341 and 1342 on the test objects 1310 and 1330 relatively far from the RF coil 1200. Accordingly, in order to make the strength of the B1 magnetic field uniform on any test object, the strength of the B1 magnetic field is increased in a portion where the strength of the B1 magnetic field is weak and the strength of the B1 magnetic field is decreased in a portion where the strength of the B1 magnetic field is strong. In the RF coil 1200 according to the present disclosure, the first and second auxiliary loop coils 1220 and 1230 generate magnetic fields 1350 and 1351 in the same direction as the direction of the B1 magnetic field generated by the main loop coil 1210 and thus the strength of the B1 magnetic field in the portion where the strength of the B1 magnetic field is weak may be increased, thereby improving uniformity of the strength of the B1 magnetic field.

As illustrated in FIGS. 10 and 12, the direction of a magnetic field generated by the auxiliary loop coil may be the same as or opposite to the direction of the B1 magnetic field generated by the main loop coil, depending on the direction of a flow of a current flowing in the auxiliary loop coils. Through the above method, the strength of B1 magnetic fields on test objects located at different distances may be made uniform. Although in FIGS. 10 and 12 the directions of magnetic fields generated by the first auxiliary loop coil 1020 and the second auxiliary loop coil 1030 of FIG. 10 are the same, and the directions of magnetic fields generated by the first auxiliary loop coil 1220 and the second auxiliary loop coil 1230 of FIG. 12 are the same, they may be different from each other.

Figure 14:
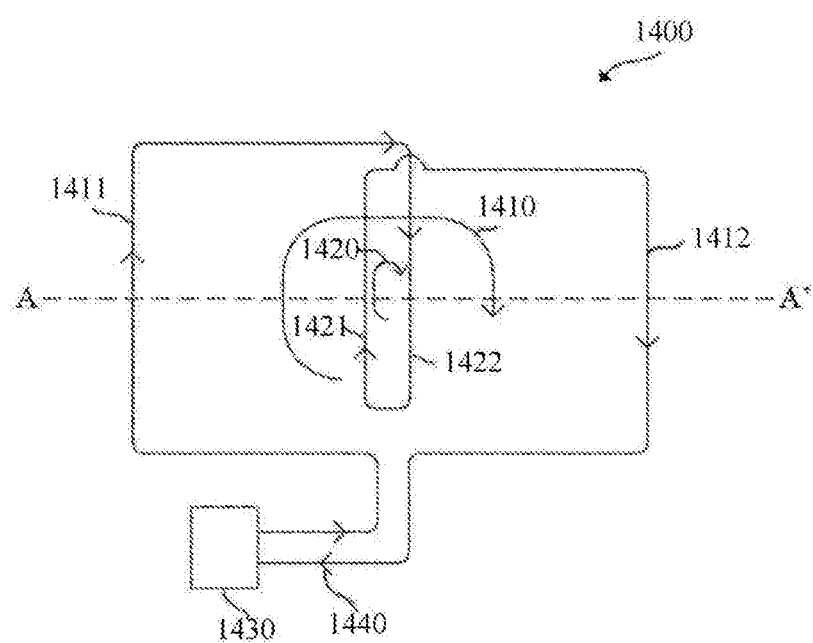
FIG. 14 illustrates another example of an RF coil according to the present disclosure.

FIG. 14 illustrates another example of an RF coil 1400 according to the present disclosure.

The RF coil 1400 may include a main loop coil 1410 having a first electric conductor 1411 and a second electric conductor 1412, which are arranged parallel to the B0 magnetic field direction, and an auxiliary loop coil 1420 having a third electric conductor 1421 and a fourth electric conductor 1422, which are arranged parallel to the first electric conductor 1411 and between the first electric conductor 1411 and the second electric conductor 1412. For convenience of explanation, a capacitor in the RF coil 1400 is omitted in the illustration. The directions of arrows in the main loop coil 1410 and the auxiliary loop coil 1420 indicate directions in which a current flows in each loop coil. Also, the RF coil 1400 includes an RF source 1430 for applying a current to the RF coil 1400. Although in the present drawing the RF source 1430 applies a current to the RF coil 1400, the RF source 1430 may apply a voltage to the RF coil 1400. Also, the RF source 1430 is necessary for a transmitting RF coil only and may not be necessary when the RF coil 1400 functions as a receiving RF coil. The direction of a current flowing in each electric conductor is indicated by an arrow 1440.

Figure 15:
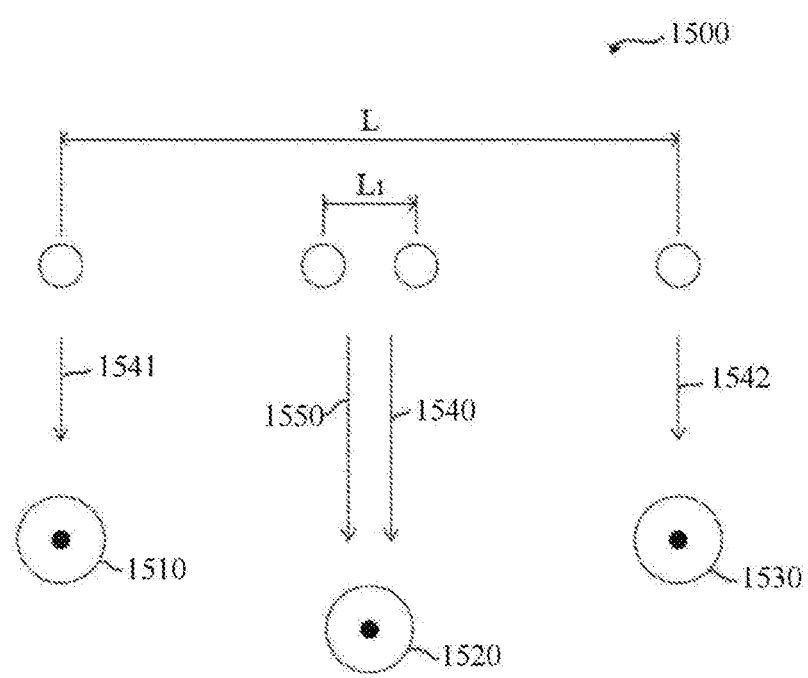
FIG. 15 is a cross-sectional view of the RF coil of FIG. 14 taken along a line AA'.

FIG. 15 is a cross-sectional view of the RF coil 1400 of FIG. 14 taken along a line AA'.

A cross-section 1500 of the RF coil 1400 taken along a line AA' shows how the RF coil 1400 according to the present disclosure improves uniformity of the strength of the B1 magnetic field on test objects 1510, 1520, and 1530 spaced by different distances from the RF coil 1400. In other words, the strength of B1 magnetic fields 1541 and 1542 on the test objects 1510 and 1530 relatively close to the RF coil 1400 is greater than the strength of a B1 magnetic field 1540 on the test object 1520 relatively far from the RF coil 1400. Accordingly, in order to make the strength of the B1 magnetic field uniform on any test object, the strength of the B1 magnetic field is increased in a portion where the strength of the B1 magnetic field is weak and the strength of the B1 magnetic field is decreased in a portion where the strength of the B1 magnetic field is strong. In the RF coil 1400 according to the present disclosure, the auxiliary loop coil 1420 generates a magnetic fields 1550 in the same direction as the direction of the B1 magnetic field generated by the main loop coil 1410 and thus the strength of the B1 magnetic field in the portion where the strength of the B1 magnetic field is weak may be increased, thereby improving uniformity of the strength of the B1 magnetic field.

However, to prevent the magnetic field generated by the auxiliary loop coil 1420 from affecting the neighboring magnetic field, a distance L1 between the third electric conductor 1421 and the fourth electric conductor 1422 of the auxiliary loop coil 1420 is sufficiently smaller than a distance L between the first electric conductor 1411 and the second electric conductor 1412 of the main loop coil 1410. The distance L1 is smaller than a distance equivalent to 0.25×L, that is, the distance L is about 4 times greater than the distance L1.

A variety of embodiments according to the present disclosure are described below.

(14) An RF coil used for a magnetic resonance imaging (MRI) system including a main loop coil having a first electric conductor and a second electric conductor, which are arranged parallel to a B0 magnetic field direction, and a first auxiliary loop coil having third electric conductor and a fourth electric conductor, which are arranged parallel to the first electric conductor and with the first electric conductor of the main loop coil interposed between the third electric conductor and the fourth electric conductor.

(15) The RF coil in which a direction of a magnetic field generated by the main loop coil is opposite to a direction of a magnetic field generated by the first auxiliary loop coil.

(16) The RF coil in which a direction of a magnetic field generated by the main loop coil is the same as a direction of a magnetic field generated by the first auxiliary loop coil.

(17) The RF coil in which a distance between the first electric conductor and the second electric conductor is about 4 times greater than a distance between the third electric conductor and the fourth electric conductor.

(18) The RF coil including one RF source for applying a current to the main loop coil and the first auxiliary loop coil.

(19) The RF coil including a second auxiliary loop coil having fifth and sixth electric conductors, which are arranged parallel to the second electric conductor of the main loop coil and with the second electric conductor interposed between the fifth and sixth electric conductors.

(20) The RF coil in which a direction of a magnetic field generated by the main loop coil is opposite to a direction of a magnetic field generated by the second auxiliary loop coil.

(21) The RF coil in which a direction of a magnetic field generated by the main loop coil is the same as a direction of a magnetic field generated by the second auxiliary loop coil.

(22) The RF coil in which a distance between the first electric conductor and the second electric conductor is about 4 times greater than a distance between the fifth electric conductor and the sixth electric conductor.

(23) The RF coil including a second auxiliary loop coil having fifth and sixth electric conductors, which are arranged parallel to the second electric conductor of the main loop coil and with the second electric conductor interposed between the fifth and sixth electric conductors.

(24) The RF coil in which a direction of a magnetic field generated by the main loop coil is opposite to a direction of a magnetic field generated by the second auxiliary loop coil.

(25) The RF coil in which a direction of a magnetic field generated by the main loop coil is the same as a direction of a magnetic field generated by the second auxiliary loop coil.

(26) The RF coil in which a distance between the first electric conductor and the second electric conductor is about 4 times greater than a distance between the fifth electric conductor and the sixth electric conductor.

(27) The RF coil used for a magnetic resonance imaging (MRI) system including a main loop coil having a first electric conductor and a second electric conductor, which are arranged parallel to a B0 magnetic field direction, and an auxiliary loop coil having third electric conductor and a fourth electric conductor, which are arranged parallel to the first electric conductor and between the first electric conductor and the second electric conductor of the main loop coil.

(28) The RF coil in which a direction of a magnetic field generated by the main loop coil is the same as a direction of a magnetic field generated by the auxiliary loop coil between the first electric conductor and the second electric conductor of the main loop coil.

(29) The RF coil in which a direction of a magnetic field generated by the main loop coil is opposite to a direction of a magnetic field generated by the auxiliary loop coil between the first electric conductor and the second electric conductor of the main loop coil.

(30) The RF coil in which a distance between the first electric conductor and the second electric conductor is about 4 times greater than a distance between the third electric conductor and the fourth electric conductor.

As an RF coil according to the present disclosure is used, irregularity of the B1 magnetic field on the test object generated due to the difference in the distance between the RF coil and the test object may be effectively reduced. Furthermore, since only one RF source for applying a current or voltage to the main loop coil and the auxiliary loop coil is used, configuration of parts of an RF coil may be simplified.

The invention claimed is:

1. A radiofrequency (RF) coil structure used for a magnetic resonance imaging (MRI) system, the RF coil structure comprising:
    a main loop coil having a first electric conductor and a second electric conductor connected to face the first electric conductor by a part of the main loop coil that lies on a main plane; and
    an auxiliary loop coil having a third electric conductor and a fourth electric conductor facing the third electric conductor, the auxiliary loop coil lying on an auxiliary plane that forms an angle α with the main plane, the third electric conductor being oriented between the first electric conductor and the second electric conductor,
    wherein the auxiliary loop coil is located on a different plane form the main loop coil.

2. The RF coil structure of claim 1, wherein at least one of the first electric conductor and the second electric conductor is parallel to a main magnetic field direction.

3. The RF coil structure of claim 1, wherein at least one of the third electric conductor and the fourth electric conductor is parallel to a main magnetic field direction.

4. The RF coil structure of claim 2, wherein at least one of the third electric conductor and the fourth electric conductor is parallel to the main magnetic field direction.

5. The RF coil structure of claim 1, wherein the main loop coil and the auxiliary loop coil are connected in series to each other.

6. The RF coil structure of claim 1, wherein one of the third electric conductor and the fourth electric conductor intersects the main loop coil.

7. The RF coil structure of claim 1, wherein the angle α is about 90°.

8. The RF coil structure of claim 1, further comprising a support body having an inner space and an outer surface on which the main loop coil is arranged.

9. The RF coil structure of claim 8, wherein a shape of the support body is cylindrical.

10. The RF coil structure of claim 8, wherein a material of the support body is an acryl material.

11. The RF coil structure of claim 8, wherein the angle α is about 90°.

12. The RF coil structure of claim 8, wherein one of the third electric conductor and the fourth electric conductor is located on a same plane as the main loop coil.

13. The RF coil structure of claim 8, wherein the main loop coil closely contacts the support body.

14. A radiofrequency (RF) coil used for a magnetic resonance imaging (MRI) system, the RF coil comprising:
    a main loop coil having a first electric conductor and a second electric conductor, which are arranged parallel to a B0 magnetic field direction; and
    a first auxiliary loop coil having a third electric conductor and a fourth electric conductor, which are arranged parallel to the first electric conductor and with the first electric conductor of the main loop coil interposed between the third electric conductor and the fourth electric conductor,
    wherein the main loop coil and the auxiliary loop coil are substantially coplanar and are different coil portions of a same coil, and wherein the third electric conductor or the fourth electric conductor of the first auxiliary loop coil is interposed between the first electric conductor and the second electric conductor.

15. The RF coil of claim 14, wherein a direction of a magnetic field generated by the main loop coil is opposite to a direction of a magnetic field generated by the first auxiliary loop coil.

16. The RF coil of claim 14, wherein a direction of a magnetic field generated by the main loop coil is the same as a direction of a magnetic field generated by the first auxiliary loop coil.

17. The RF coil of claim 14, wherein a distance between the first electric conductor and the second electric conductor is about 4 times greater than a distance between the third electric conductor and the fourth electric conductor.

18. The RF coil of claim 14, further comprising one RF source for applying a current to the main loop coil and the first auxiliary loop coil.

19. The RF coil of claim 15, further comprising a second auxiliary loop coil having a fifth electric conductor and a sixth electric conductor, which are arranged parallel to the second electric conductor of the main loop coil and with the second electric conductor interposed between the fifth and sixth electric conductors.

20. The RF coil of claim 19, wherein the direction of the magnetic field generated by the main loop coil is opposite to a direction of a magnetic field generated by the second auxiliary loop coil.

21. The RF coil of claim 19, wherein the direction of the magnetic field generated by the main loop coil is the same as a direction of a magnetic field generated by the second auxiliary loop coil.

22. The RF coil of claim 19, wherein a distance between the first electric conductor and the second electric conductor is about 4 times greater than a distance between the fifth electric conductor and the sixth electric conductor.

23. The RF coil of claim 16, further comprising a second auxiliary loop coil having a fifth electric conductor and a sixth electric conductor, which are arranged parallel to the second electric conductor of the main loop coil and with the second electric conductor interposed between the fifth and sixth electric conductors.

24. The RF coil of claim 23, wherein the direction of the magnetic field generated by the main loop coil is opposite to a direction of a magnetic field generated by the second auxiliary loop coil.

25. The RF coil of claim 23, wherein the direction of the magnetic field generated by the main loop coil is the same as a direction of a magnetic field generated by the second auxiliary loop coil.

26. The RF coil of claim 23, wherein a distance between the first electric conductor and the second electric conductor is about 4 times greater than a distance between the fifth electric conductor and the sixth electric conductor.

27. A radiofrequency (RF) coil used for a magnetic resonance imaging (MRI) system, the RF coil comprising:
    a main loop coil having a first electric conductor and a second electric conductor, which are arranged parallel to a B0 magnetic field direction; and
    an auxiliary loop coil having a third electric conductor and a fourth electric conductor, which are arranged parallel to the first electric conductor and between the first electric conductor and the second electric conductor of the main loop coil,
    wherein the main loop coil and the auxiliary loop coil are substantially coplanar and are different coil portions of a same coil, and
    wherein a distance between the first electric conductor and the second electric conductor is about 4 times greater than a distance between the third electric conductor and the fourth electric conductor.

28. The RF coil of claim 27, wherein a direction of a magnetic field generated by the main loop coil is the same as a direction of a magnetic field generated by the auxiliary loop coil.

29. The RF coil of claim 27, wherein a direction of a magnetic field generated by the main loop coil is opposite to a direction of a magnetic field generated by the auxiliary loop coil.

30. The RF coil structure of claim 1, wherein the third electric conductor is equidistant from the first electric conductor and the second electric conductor.

31. The RF coil structure of claim 1, wherein
    the main loop coil is configured to generate a magnetic field by current flow through the main loop coil, and
    the auxiliary loop coil is configured to modify the magnetic field generated by the main loop coil.

32. The RF coil structure of claim 1, wherein
    the main loop coil is configured to generate a magnetic field by current flow through the main loop coil, and
    the auxiliary loop coil is configured to modify the magnetic field generated by the main loop coil.

* * * * *